US012706149B2

(12) United States Patent
Chen et al.

(10) Patent No.: US 12,706,149 B2
(45) Date of Patent: Aug. 11, 2026

(54) STATE DEPENDENT SUSPEND-RESUME-GO FOR PERFORMANCE IMPROVEMENT IN A MEMORY DEVICE

(71) Applicant: Sandisk Technologies, Inc., Milpitas, CA (US)

(72) Inventors: Albert Chen, Milpitas, CA (US); Jiahui Yuan, Fremont, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 125 days.

(21) Appl. No.: 18/389,332

(22) Filed: Nov. 14, 2023

(65) Prior Publication Data

US 2025/0157539 A1 May 15, 2025

(51) Int. Cl.
*G11C 16/10* (2006.01)
*G11C 16/34* (2006.01)

(52) U.S. Cl.
CPC .......... *G11C 16/10* (2013.01); *G11C 16/3459* (2013.01); *G11C 2216/20* (2013.01)

(58) Field of Classification Search
CPC .................................................. G11C 2216/20
See application file for complete search history.

(56) References Cited

U.S. PATENT DOCUMENTS

2019/0088313 A1* 3/2019 Kondo ................ G11C 11/5642
2019/0171360 A1* 6/2019 Lee ...................... G06F 3/0604
2021/0335433 A1* 10/2021 Harada .................. G11C 16/08
2021/0343352 A1* 11/2021 Cho ....................... G11C 16/26
2023/0326531 A1* 10/2023 Wang ..................... G11C 16/08
365/185.17
2025/0004789 A1* 1/2025 Ng ........................ G06F 9/4418

* cited by examiner

*Primary Examiner* — Uyen Smet
(74) *Attorney, Agent, or Firm* — Dickinson Wright PLLC

(57) ABSTRACT

The memory device includes a memory block with an array of memory cells that are arranged word lines. The memory device also includes circuitry that is configured to program the memory cells of a selected word line of the plurality of word lines. During programming, the circuitry is configured to, in a program loop, apply a programming pulse at a programming voltage VPGM to a selected word line to program a plurality of the memory cells of the selected word line to a target data state. The circuitry is also configured to suspend the programming operation for a suspension duration and then resume the programming operation. Before a next program loop, the circuitry is further configured to increase a programming voltage VPGM by a step size that is determined based on the suspension duration and on the targeted data state.

14 Claims, 18 Drawing Sheets

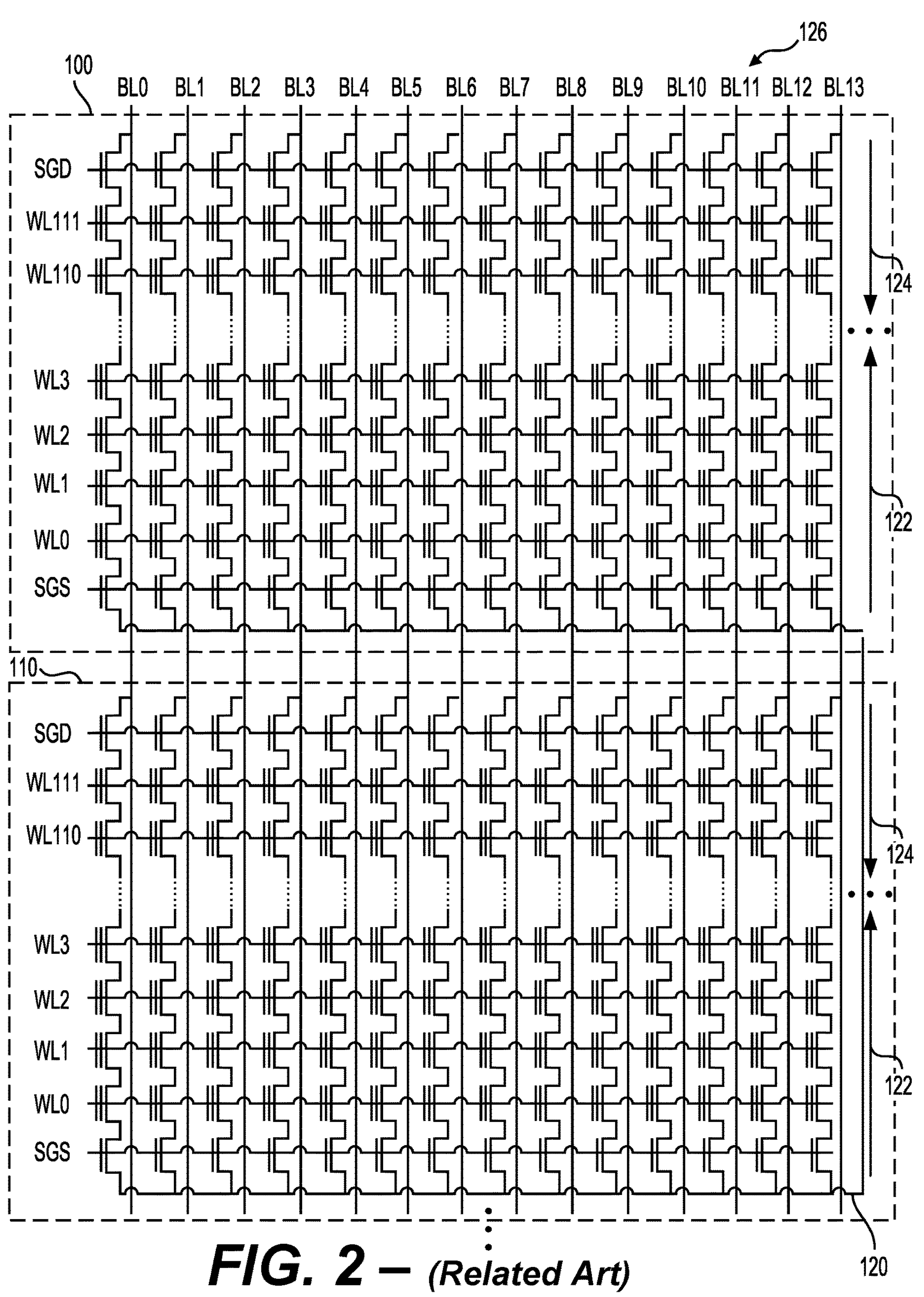
FIG. 2 – (Related Art)

330
SGS, 331
300
333
334
335
SGD, 336
$V_{CH}$
328
302
305
304
• • •
sd1
sd2
sd3
sd4
sd5
sd6
sd7

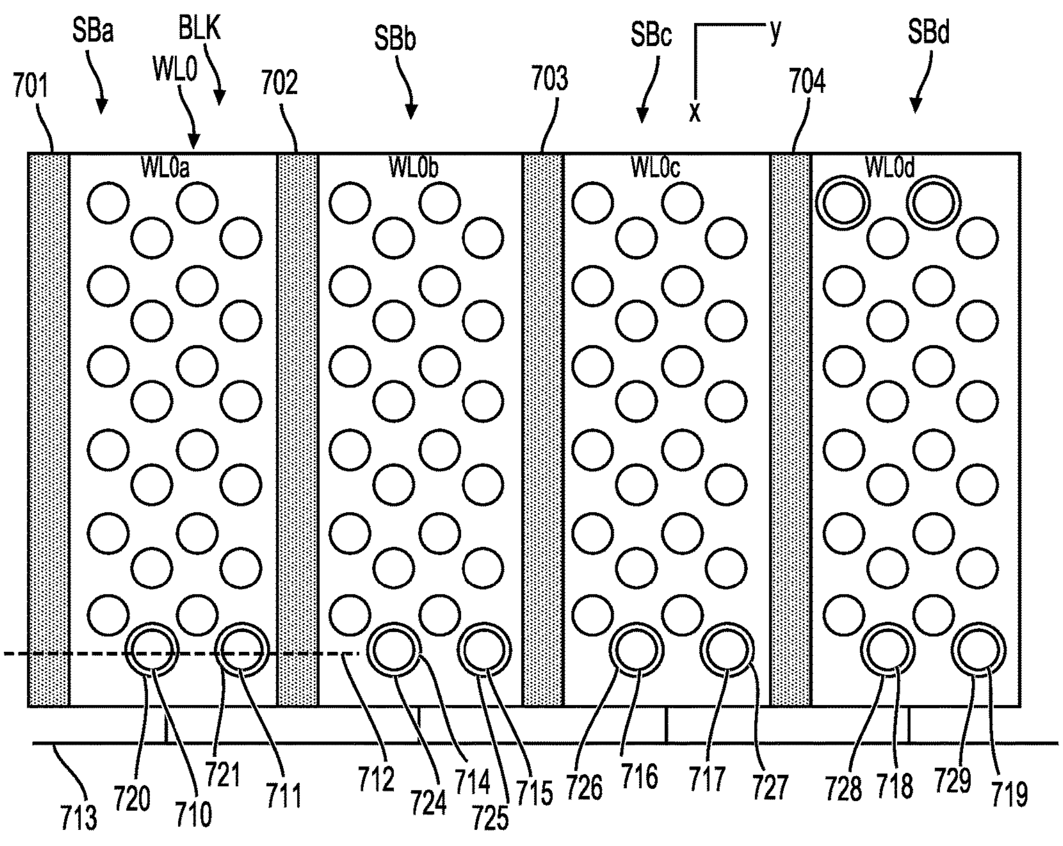
FIG. 7A – (Related Art)
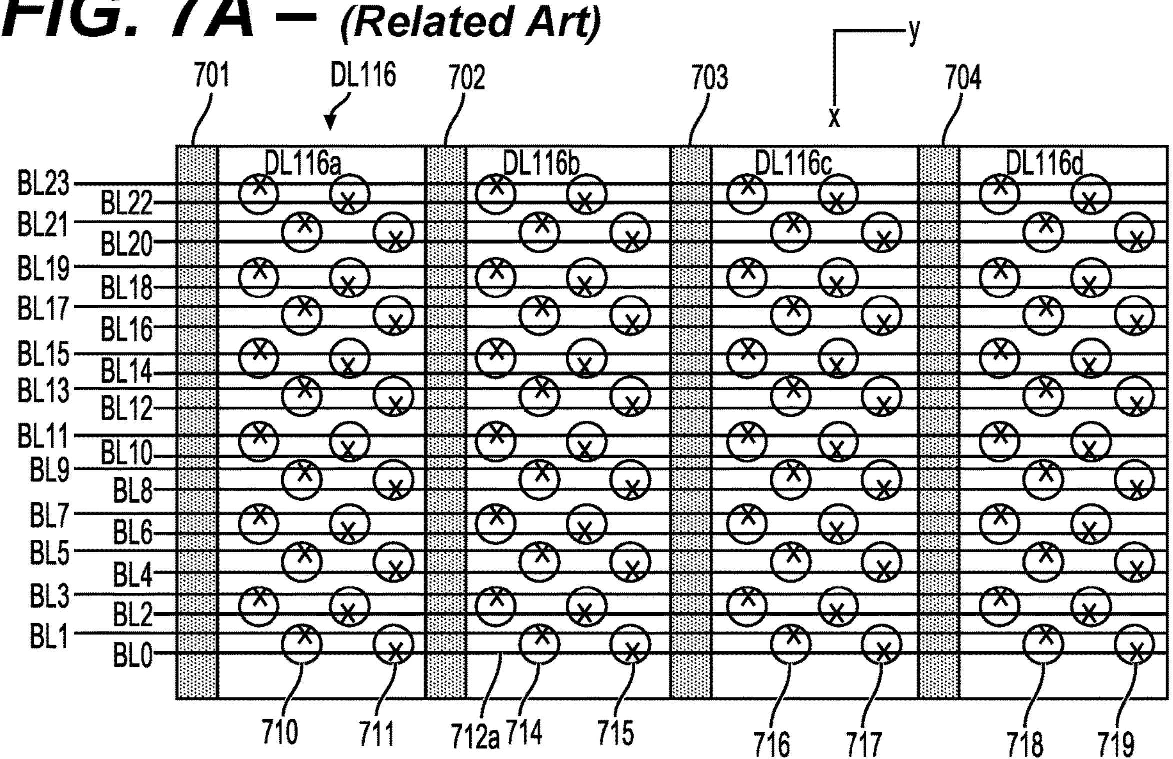
FIG. 7B - (Related Art)

| EQUIVALENT STATE | DELAY TIME (SUSPEND START) | SUSPEND TIME SRG_FSTEP_"STATE" | SRG |
|---|---|---|---|
| S1 | < 200 μs | > 10s | NO SRG |
| S2 | 200~ 300 μs | > 500 ms | YES |
| S3 | 300~ 400 μs | > 100 ms | YES |
| S4 | 400~ 500 μs | > 50 ms | YES |
| S5 | 500~ 600 μs | > 10 ms | YES |
| S6 | > 650 μs | > 10 ms | YES |

FIG. 15

STATE DEPENDENT SUSPEND-RESUME-GO FOR PERFORMANCE IMPROVEMENT IN A MEMORY DEVICE

BACKGROUND

1. Field

The subject disclosure is related generally to techniques for programming memory cells in word lines and, more particularly, to techniques for improving the programming of the memory cells after a suspension occurs.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a chip with a plurality of memory blocks, each of which includes an array of memory cells arranged in a plurality of word lines. Programming the memory cells of a word line to retain data typically occurs in a plurality of program loops, each of which includes the application of a programming pulse to a control gate of the word line and, optionally, a verify operation to sense the threshold voltages of the memory cells being programmed. Each program loop may also include a pre-charge operation prior to the programming pulse to pre-charge a plurality of channels containing memory cells to be programmed.

SUMMARY

One aspect of the present disclosure is related to a method of performing a programming operation in a memory device. The method includes the step of preparing a memory block that includes an array of memory cells that are arranged in a plurality of word lines. In a program loop, the method continues with the step of applying a programming pulse at a programming voltage VPGM to a selected word line of the plurality of word lines to program a plurality of the memory cells of the selected word line to a target data state of a plurality of data states. The method proceeds with the step of suspending the programming operation for a suspension duration and then resuming the programming operation. Before a next program loop, the method continues with the step of increasing a programming voltage VPGM by a step size that is determined based on the suspension duration and on the targeted data state.

According to another aspect of the present disclosure, the step of increasing the programming voltage by the step size that is determined based on the suspension duration and the targeted data state includes, in response to the suspension duration being less than or equal to a threshold duration that is associated with the target data state, prior to a next programming pulse of a following program loop, incrementally increasing the programming voltage VPGM by a baseline step size dVPGM. In response to the suspension duration being greater than the threshold duration that is associated with the target data state, prior to the next programming pulse of a following program loop, then this step includes incrementally increasing the programming voltage VPGM by a reduced step size dVPGM_SRG that is less than the baseline step size dVPGM.

According to yet another aspect of the present disclosure, at least two of the plurality of data states are associated with different threshold durations.

According to still another aspect of the present disclosure, the threshold duration of at least one of the plurality of data states, which is at a higher voltage range, is less than the threshold duration of at least one of the plurality of data states, is at a lower voltage range.

According to a further aspect of the present disclosure, the method further includes the step of determining a delay time that is from a start of the programming operation to a beginning of the step of suspending the programming operation. The target data state is determined based on the delay time.

According to yet a further aspect of the present disclosure, in response to the target data state being a first programmed data states of the plurality of data states, then the step size is a baseline step size dVPGM.

According to still a further aspect of the present disclosure, in response to the target data state being a last programmed data state of the plurality of data states, then the step size is a baseline step size dVPGM.

According to another aspect of the present disclosure, the program loop further includes a verify operation that includes at least a first verify pulse at a verify low voltage and a second verify pulse at a verify high voltage. The method continues with the step of applying a quick pass write (QPW) biasing voltage to a bit line coupled to a selected memory cell of the selected word line in response to the selected memory cells being detected in the verify operation as having a threshold voltage that is between the verify low voltage and the verify high voltage.

Another aspect of the present disclosure is related to a memory device. The memory device includes a memory block with an array of memory cells that are arranged in a plurality of word lines. The memory device also includes circuitry that is configured to program the memory cells of a selected word line of the plurality of word lines. During programming, the circuitry is configured to, in a program loop, apply a programming pulse at a programming voltage VPGM to a selected word line of the plurality of word lines to program a plurality of the memory cells of the selected word line to a target data state of a plurality of data states. The circuitry is also configured to suspend the programming operation for a suspension duration and then resuming the programming operation. Before a next program loop, the circuitry is further configured to increase a programming voltage VPGM by a step size that is determined based on the suspension duration and on the targeted data state.

According to another aspect of the present disclosure, when increasing the programming voltage by the step size that is determined based on the suspension duration and the targeted data state, the circuitry is configured to, in response to the suspension duration being less than or equal to a threshold duration that is associated with the target data state, prior to a next programming pulse of a following program loop, incrementally increase the programming voltage VPGM by a baseline step size dVPGM. The circuitry is also configured to, in response to the suspension duration being greater than the threshold duration that is associated with the target data state, prior to the next programming pulse of a following program loop, incrementally increase the programming voltage VPGM by a reduced step size dVPGM_SRG that is less than the baseline step size dVPGM.

According to yet another aspect of the present disclosure, at least two of the plurality of data states are associated with different threshold durations.

According to still another aspect of the present disclosure, the threshold duration of at least one of the plurality of data states, which is at a higher voltage range, is less than the threshold duration of at least one of the plurality of data states, is at a lower voltage range.

According to a further aspect of the present disclosure, the circuitry is further configured to determine a delay time that is from a start of the programming operation to a beginning of the step of suspending the programming operation and to determine the target data state based on the delay time.

According to yet a further aspect of the present disclosure, in response to the target data state being a first programmed data states of the plurality of data states, then the step size is a baseline step size dVPGM.

According to still a further aspect of the present disclosure, in response to the target data state being a last programmed data state of the plurality of data states, then the step size is a baseline step size dVPGM.

According to another aspect of the present disclosure, the program loop further includes the circuitry performing a verify operation that includes at least a first verify pulse at a verify low voltage and a second verify pulse at a verify high voltage. The circuitry is further configured to apply a quick pass write (QPW) biasing voltage to a bit line coupled to a selected memory cell of the selected word line in response to the selected memory cells being detected in the verify operation as having a threshold voltage that is between the verify low voltage and the verify high voltage.

Yet another aspect of the present disclosure is related to an apparatus. The apparatus includes a memory block with an array of memory cells that are arranged in a plurality of word lines. The apparatus also includes a programming means that is configured to program the memory cells of a selected word line of the plurality of word lines. During programming, the programming means being configured to, in a program loop, apply a programming pulse at a programming voltage VPGM to a selected word line of the plurality of word lines to program a plurality of the memory cells of the selected word line to a target data state of a plurality of data states. The programming means is configured to suspend the programming operation for a suspension duration and then resuming the programming operation. Before a next program loop, the programming means is configured to increase a programming voltage VPGM by a step size that is determined based on the suspension duration and on the targeted data state.

According to another aspect of the present disclosure, when increasing the programming voltage by the step size that is determined based on the suspension duration and the targeted data state, the programming means is configured to, in response to the suspension duration being less than or equal to a threshold duration that is associated with the target data state, prior to a next programming pulse of a following program loop, incrementally increase the programming voltage VPGM by a baseline step size dVPGM. In response to the suspension duration being greater than the threshold duration that is associated with the target data state, prior to the next programming pulse of a following program loop, the programming means is further configured to incrementally increase the programming voltage VPGM by a reduced step size dVPGM_SRG that is less than the baseline step size dVPGM.

According to yet another aspect of the present disclosure, at least two of the plurality of data states are associated with different threshold durations.

According to still another aspect of the present disclosure, the threshold duration of at least one of the plurality of data states, which is at a higher voltage range, is less than the threshold duration of at least one of the plurality of data states, is at a lower voltage range.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 2 depicts blocks of memory cells in an example two-dimensional configuration of the memory array of FIG. 1A;

FIG. 7A depicts a top view of an example word line layer WL0 of the stack of FIG. 6B;

FIG. 7B depicts a top view of an example top dielectric layer DL116 of the stack of FIG. 6B;

FIG. 15 is a table depicting different programmed data states, the delay times associated with those programmed data states, the threshold suspension durations associated with those programmed data states, and whether the reduced programming pulse step size should be employed if the suspension duration exceeds the threshold suspension duration.

DESCRIPTION OF THE ENABLING EMBODIMENTS

According to an aspect of the subject disclosure, a programming technique is provided for avoiding over programming in the event that a suspension occurs during a programming operation. More specifically, when a suspension event occurs, its length is measured to establish a suspension duration. When programming resumes, the suspension duration is compared to a threshold duration that is unique to a target data state at the time that the suspension event began. If the suspension duration is greater than the threshold duration for the target data state, then prior to a next programming pulse, a programming voltage VPGM is increased by a reduced step size dVPGM_SRG as compared to a baseline step size dVPGM. These steps and others are discussed in further detail below.

Figures 1A, 1B:
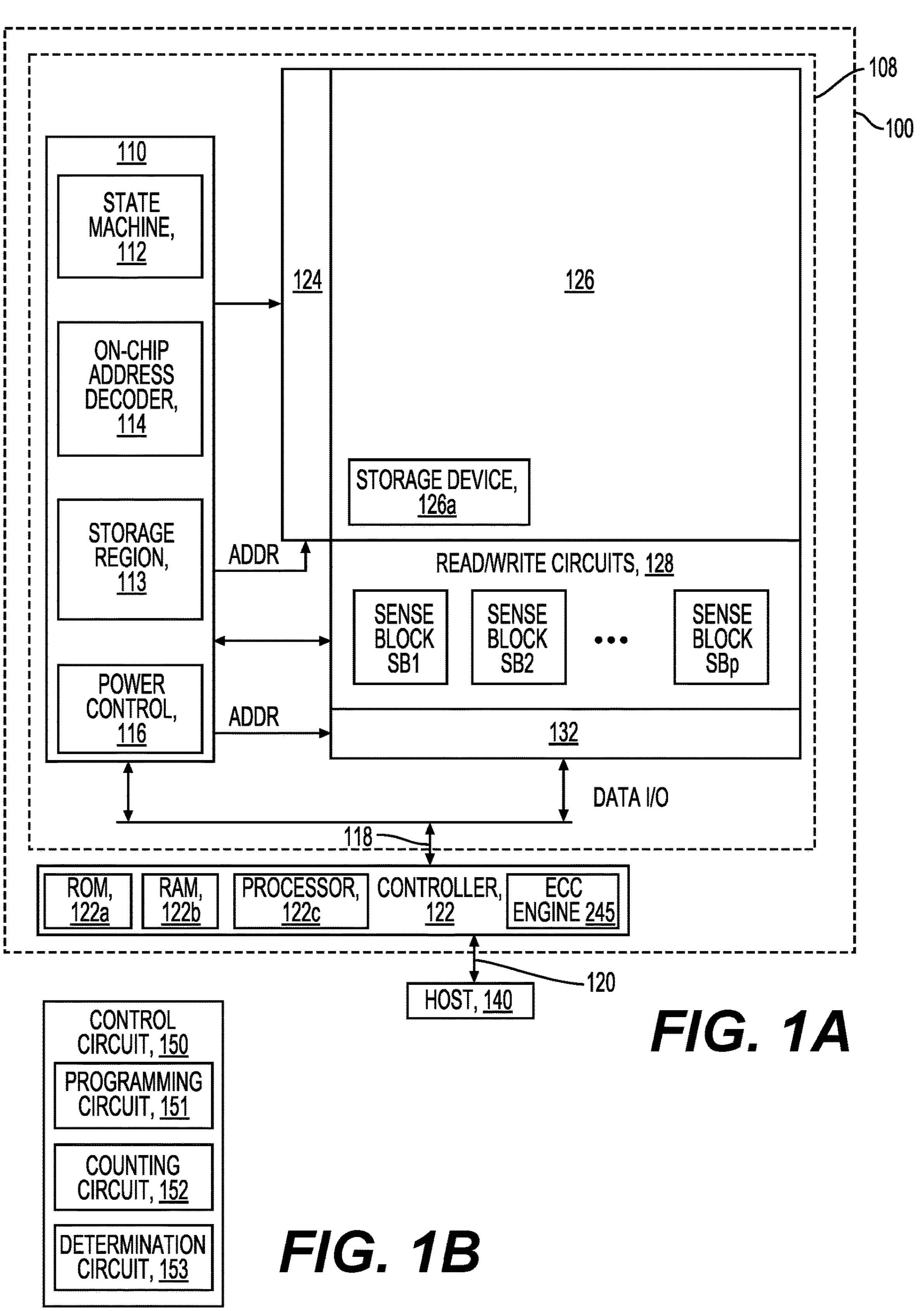
FIG. 1A is a block diagram of an example memory device.
FIG. 1B is a block diagram of an example control circuit.

FIG. 1A is a block diagram of an example memory device 100 is configured to program the memory cells in the word lines of a memory block according to the programming techniques of the subject disclosure. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits 150 can include a programming circuit 151 configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits 150 can also include a counting circuit 152 configured to obtain a count of memory cells which pass a verify test for the one data state. The control circuits 150 can also include a determination circuit 153 configured to determine, based on an amount by which the count exceeds a threshold, if a programming operation is completed.

For example, FIG. 1B is a block diagram of an example control circuit 150 which comprises the programming circuit 151, the counting circuit 152, and the determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vt distribution becomes too high. However, uncorrectable errors may exist in some cases. The techniques provided herein reduce the likelihood of uncorrectable errors.

The storage device(s) 122_a_, 122_b_ comprise, code such as a set of instructions, and the processor 122_c_ is operable to execute the set of instructions to provide the functionality described herein. Alternately or additionally, the processor 122_c_ can access code from a storage device 126_a_ of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122_c_ fetches the boot code from the ROM 122_a_ or storage device 126_a_ for execution, and the boot code initializes the system components and loads the control code into the RAM 122_b_. Once the control code is loaded into the RAM 122_b_, it is executed by the processor 122_c_. The control code includes drivers to perform basic tasks such as controlling and allocating memory, prioritizing the processing of instructions, and controlling input and output ports.

Figure 1C:
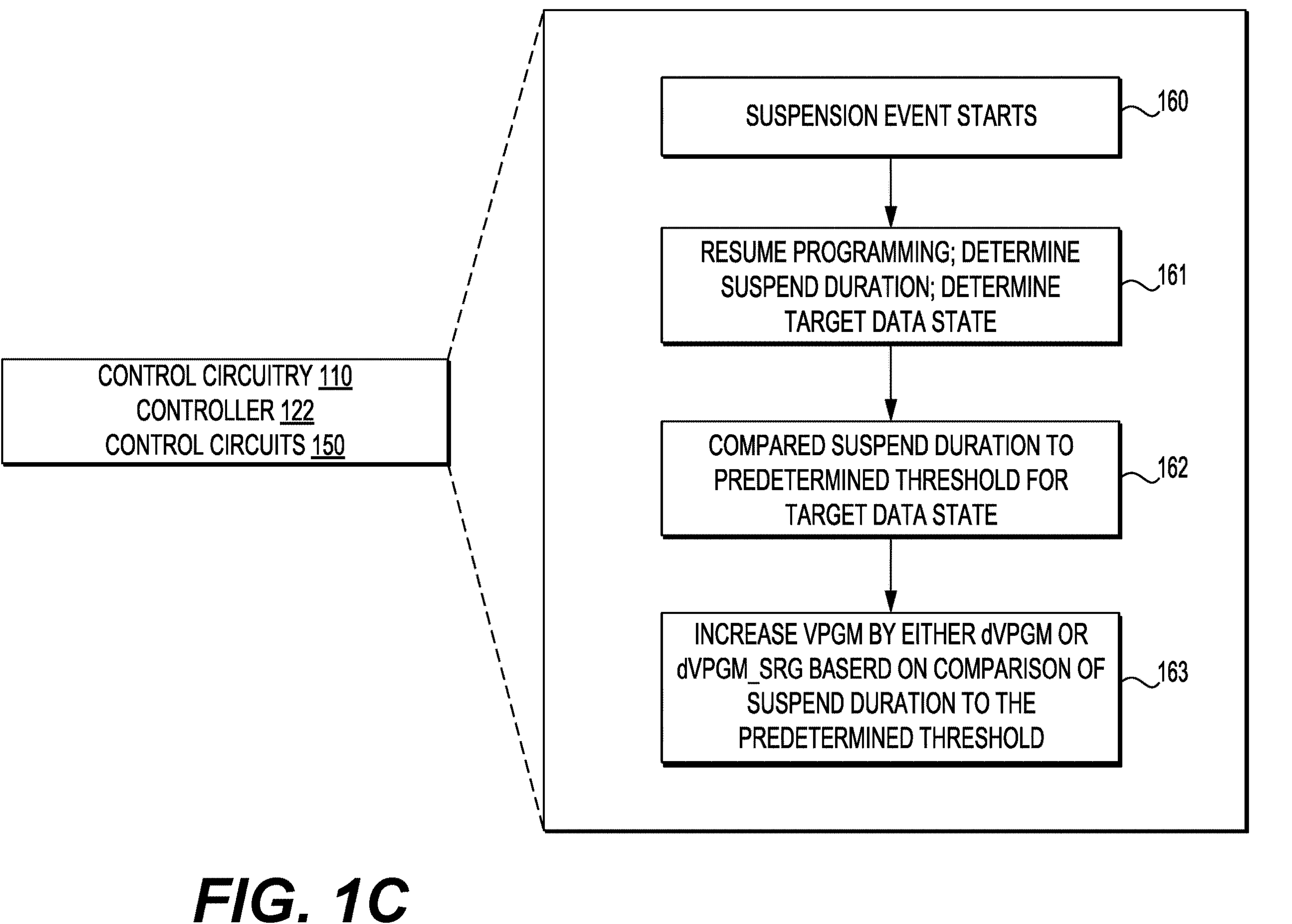
FIG. 1C is a block diagram of example circuitry of the memory device of FIG. 1A.

Generally, the control code can include instructions to perform the functions described herein including the steps of the flowcharts discussed further below and provide the voltage waveforms including those discussed further below. For example, as illustrated in FIG. 1C, the control circuitry 110, controller 122, control circuits 150, and/or any other circuitry are configured/programmed, during a programming operation, at step 160 to begin a suspension event. The suspension event could be, for example, the memory device performing a read operation in another memory block. At step 161, programming resumes. Also at this step, a suspension duration (a length of the suspension event) is established, and a target data state is determined. At step 162, the suspension duration is compared to a predetermined threshold that is unique to the target data state. At step 163, prior to the next programming pulse, the programming voltage VPGM is increased either by a baseline step size dVPGM if the suspension duration was less than the predetermined threshold or by a reduced step size dVPGM_SRG if the suspension duration was greater than the predetermined threshold.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates memory blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain-side select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors or between certain data word lines. Such dummy word lines can shield the edge data word line from certain edge effects.

Figures 3A, 3B:
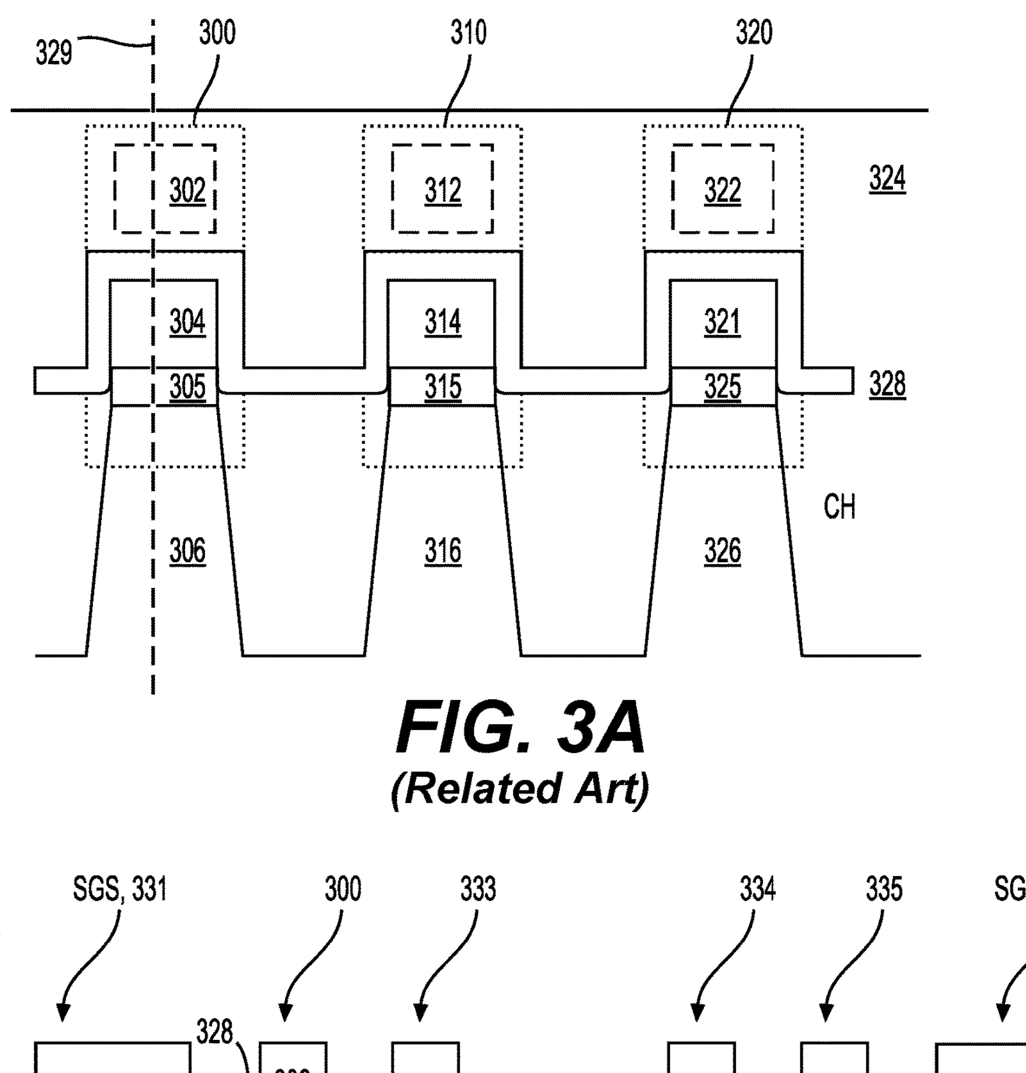
FIG. 3A and FIG. 3B depict cross-sectional views of example floating gate memory cells in NAND strings.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figures 4A, 4B:
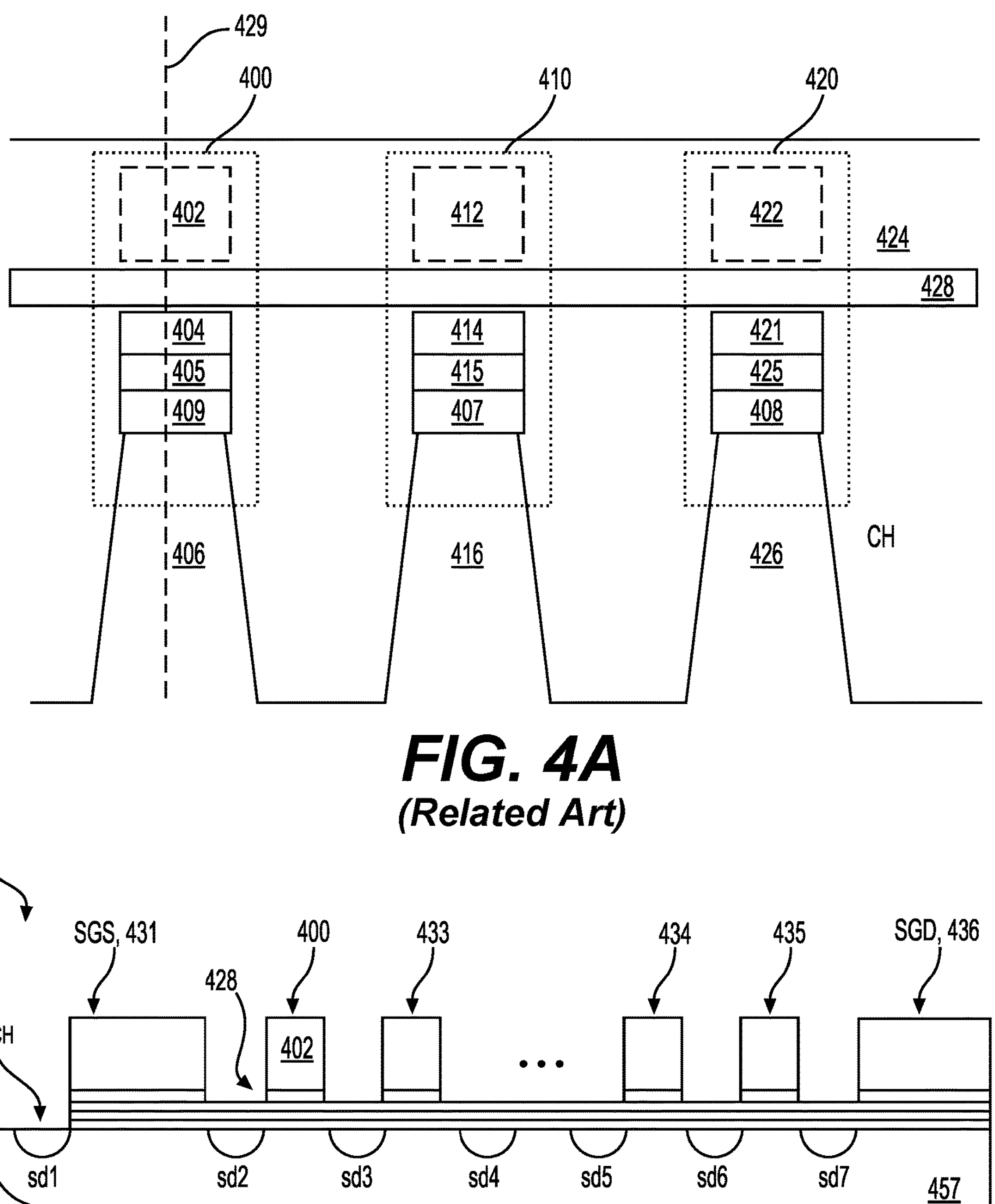
FIG. 4A and FIG. 4B depict cross-sectional views of example charge-trapping memory cells in NAND strings.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
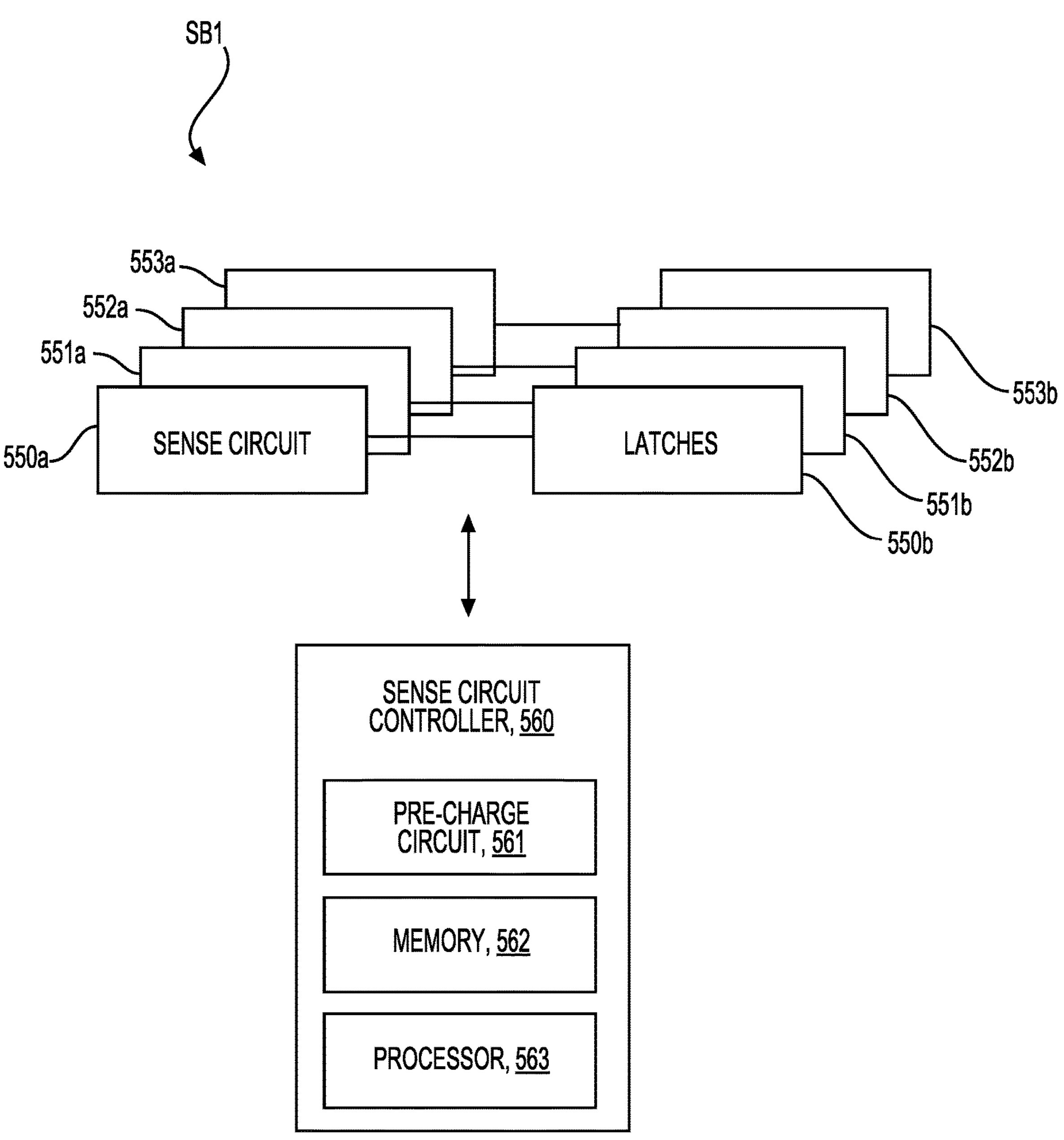
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550*a*, 551*a*, 552*a*, and 553*a* are associated with the data latches 550*b*, 551*b*, 552*b*, and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550*b*, 551*b*, 552*b*, 553*b* which are associated with the sense circuits 550*a*, 551*a*, 552*a*, 553*a*, setting bit values in the latches and providing voltages for setting pre-charge levels in sense nodes of the sense circuits 550*a*, 551*a*, 552*a*, 553*a*. Further example details of the sense circuit controller 560 and the sense circuits 550*a*, 551*a*, 552*a*, 553*a* are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
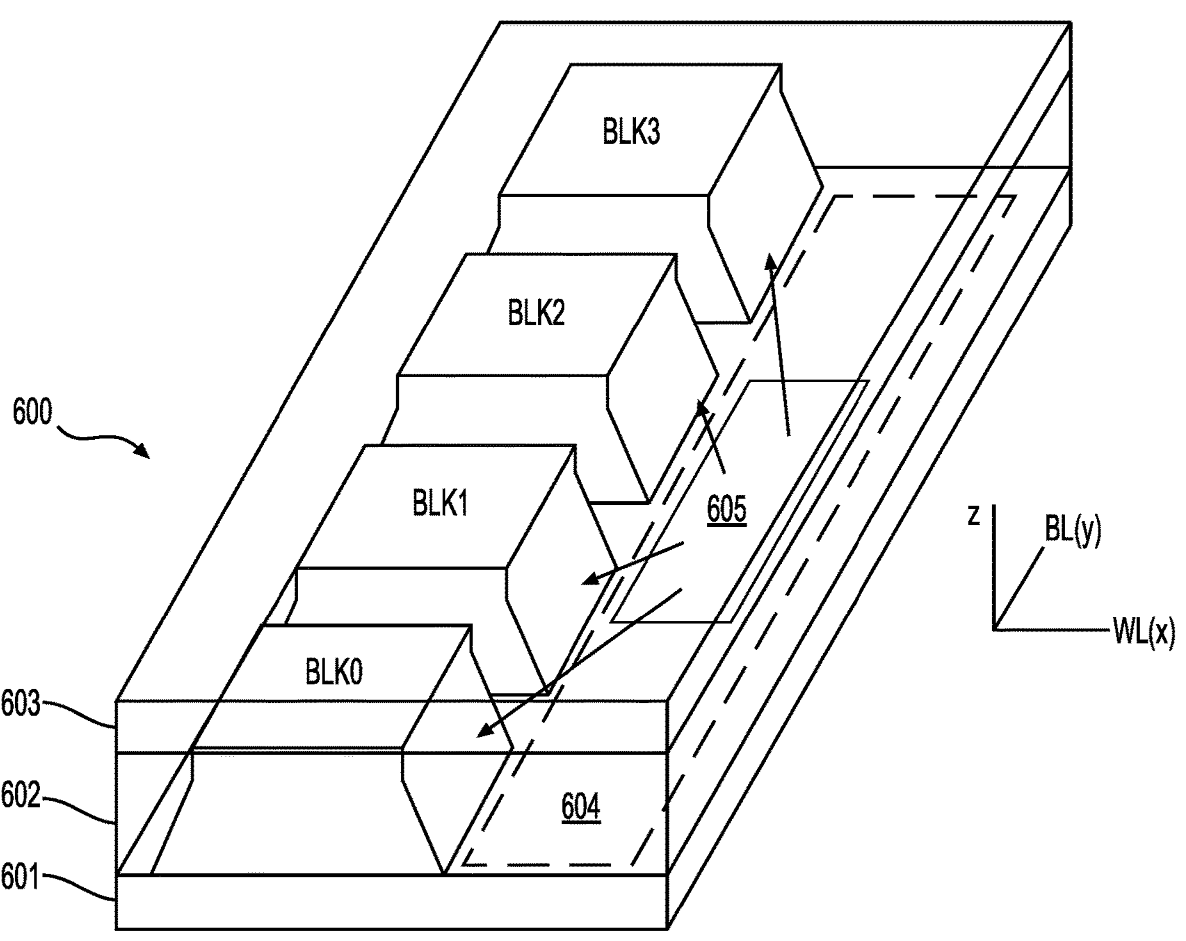
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
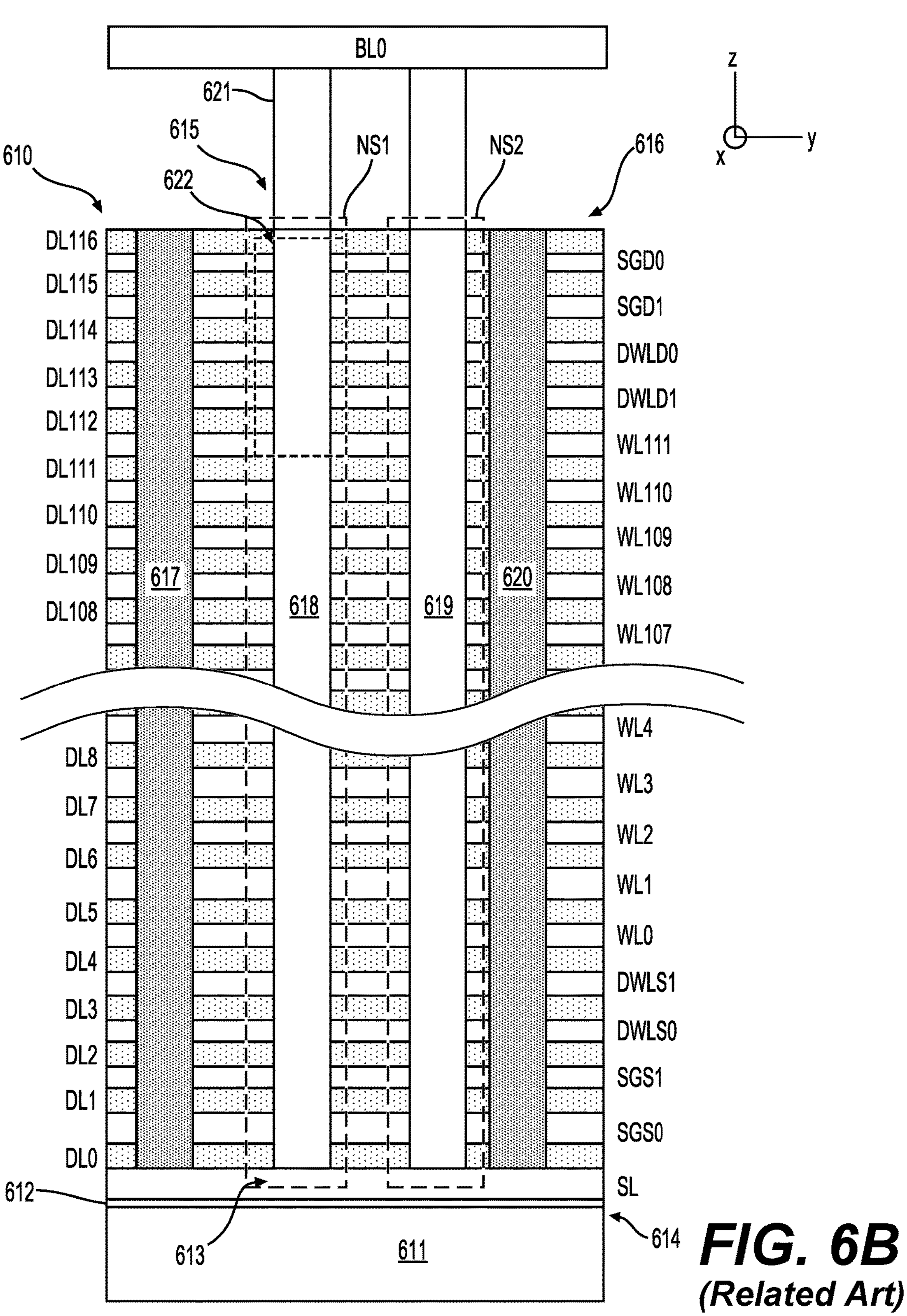
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below. The dielectric layers can have variable thicknesses such that some of the conductive layers can be closer to or further from neighboring conductive layers. The thicknesses of the dielectric layers affects the "ON pitch," which is a factor in memory density. Specifically, a smaller ON pitch allows for more memory cells in a given area but may compromise reliability.

The stack 610 includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
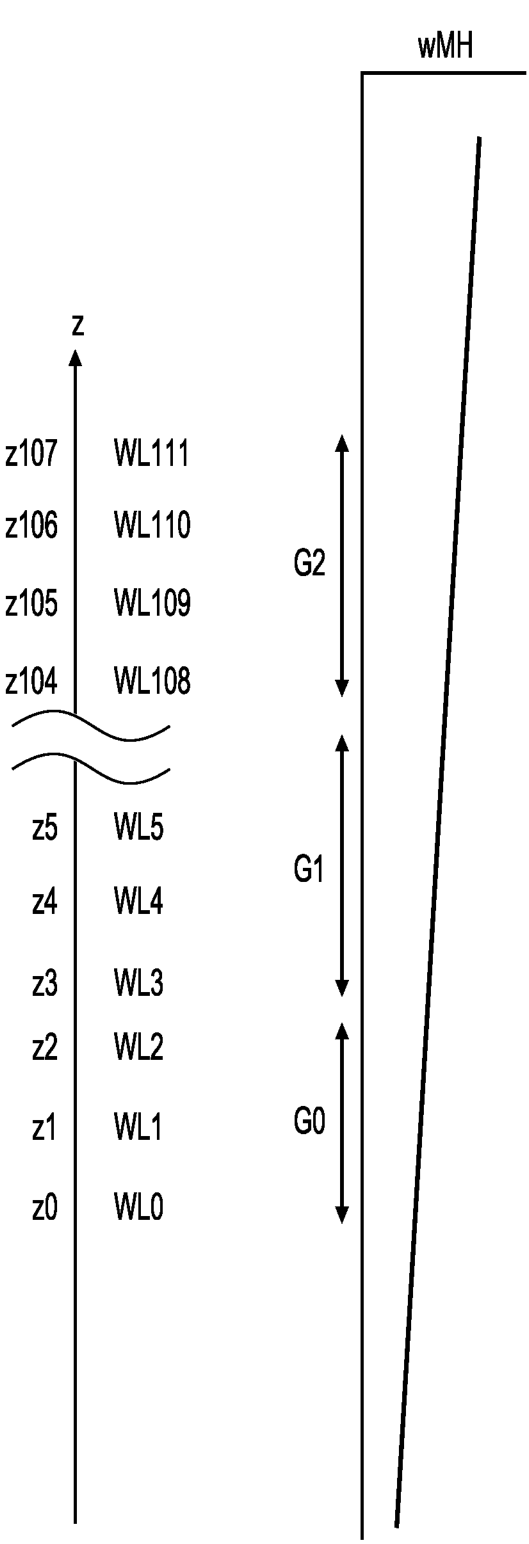
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Figure 6D:
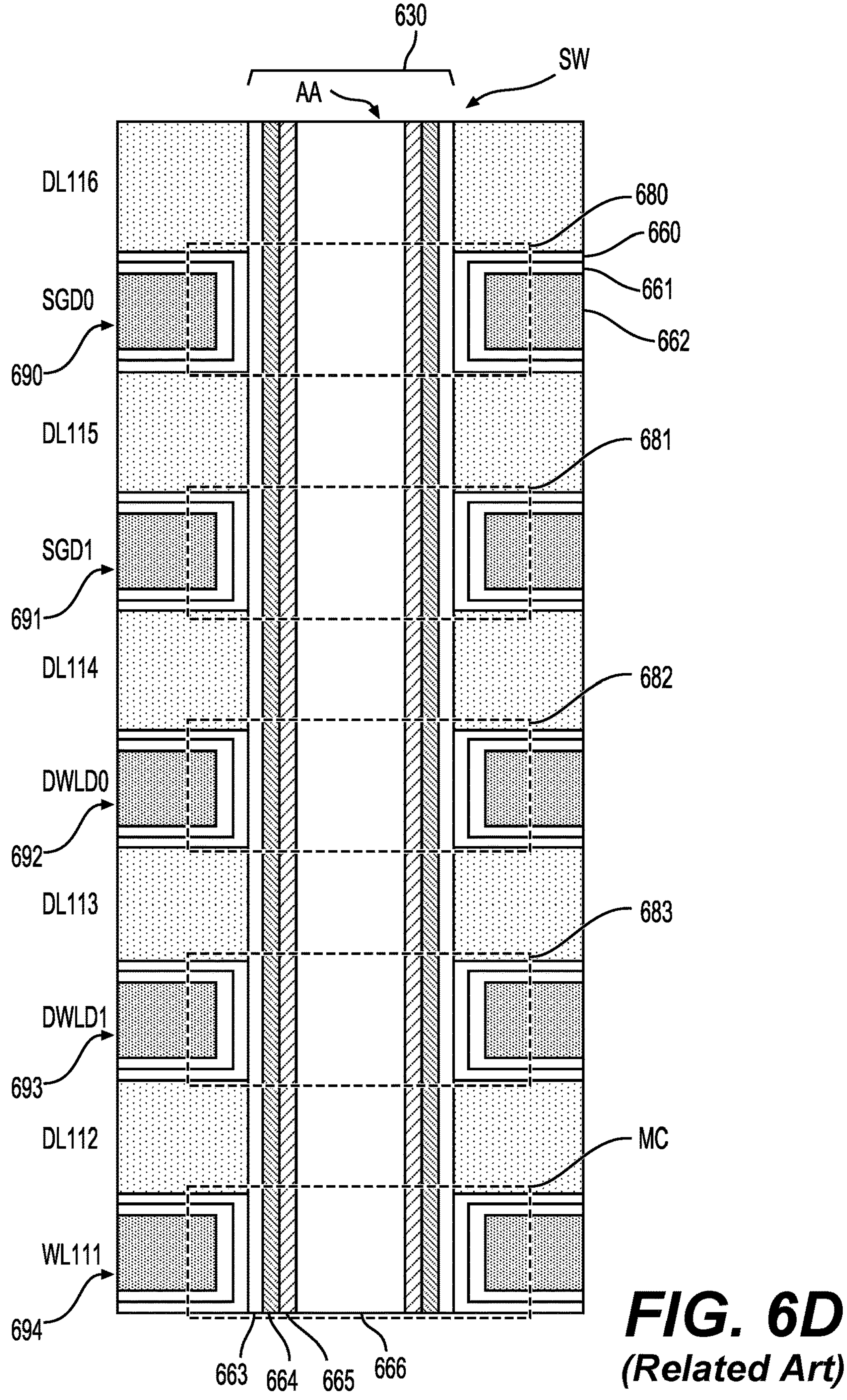
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage Vt of a memory cell is increased in proportion to the amount of stored charge. During a sensing operation, the threshold voltage Vt is detected or measured. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of layers are between the core region and the word line layer in each of the memory holes 630. In some cases, the charge trapping layer 663 and the tunneling layer 664 are annular in shape. In other cases, as discussed in further detail below, these layers are semi-circular in shape.

The NAND string can be considered to have a floating body channel because the length of the channel is not formed on a substrate. Further, the NAND string is provided by a plurality of word line layers above one another in a stack, and separated from one another by dielectric layers.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0*a*, WL0*b*, WL0*c* and WL0*d* which are each connected by a contact line 713. The last region of a word line layer in a block can be connected to a first region of a word line layer in a next block, in one approach. The contact line 713, in turn, is connected to a voltage driver for the word line layer. The region WL0*a* has example memory holes 710, 711 along a contact line 712. The region WL0*b* has example memory holes 714, 715. The region WL0*c* has example memory holes 716, 717. The region WL0*d* has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0*a*, memory cells 724, 725 are in WL0*b*, memory cells 726, 727 are in WL0*c*, and memory cells 728, 729 are in WL0*d*. These memory cells are at a common height in the stack.

Contact line connectors (e.g., slits, such as metal-filled slits) 701, 702, 703, 704 may be located between and adjacent to the edges of the regions WL0*a*-WL0*d*. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116*a*, DL116*b*, DL116*c* and DL116*d*. Each region can be connected to a respective voltage driver. This allows a set of memory cells in one region of a word line layer being programmed concurrently, with each memory cell being in a respective NAND string which is connected to a respective bit line. A voltage can be set on each bit line during each programming, sensing, or erasing operation.

The region DL116*a* has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figures 8, 9:
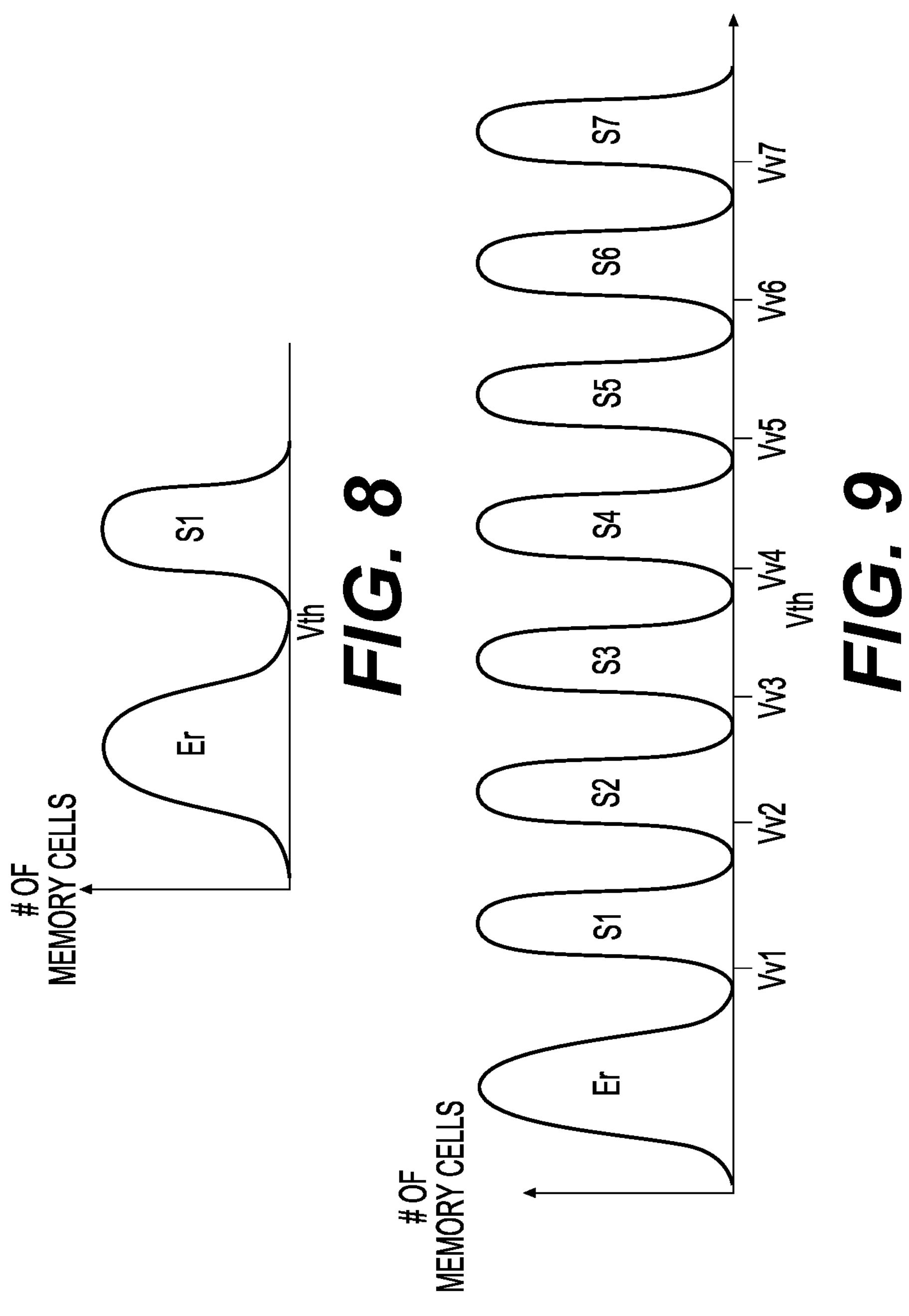
FIG. 8 depicts a threshold voltage distribution of a page of memory cells programmed to one bit per memory cell (SLC)
FIG. 9 depicts a threshold voltage distribution of a page of memory cells programmed to three bits per memory cell (TLC)

The memory cells of the memory blocks can be programmed to store one or more bits of data in multiple data states, each of which is associated with a respective threshold voltage Vt range and with a respective bit or series of bits. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, namely the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation. Similarly, each programmed data state is associated with a unique read voltage that can be the same or different than the respective verify voltages. Other storage schemes are also available, such as two bits per cell (MLC) with four data states, four bits per cell (QLC) with sixteen data states, or five bits per cell (PLC) with thirty-two data states.

Figure 10:
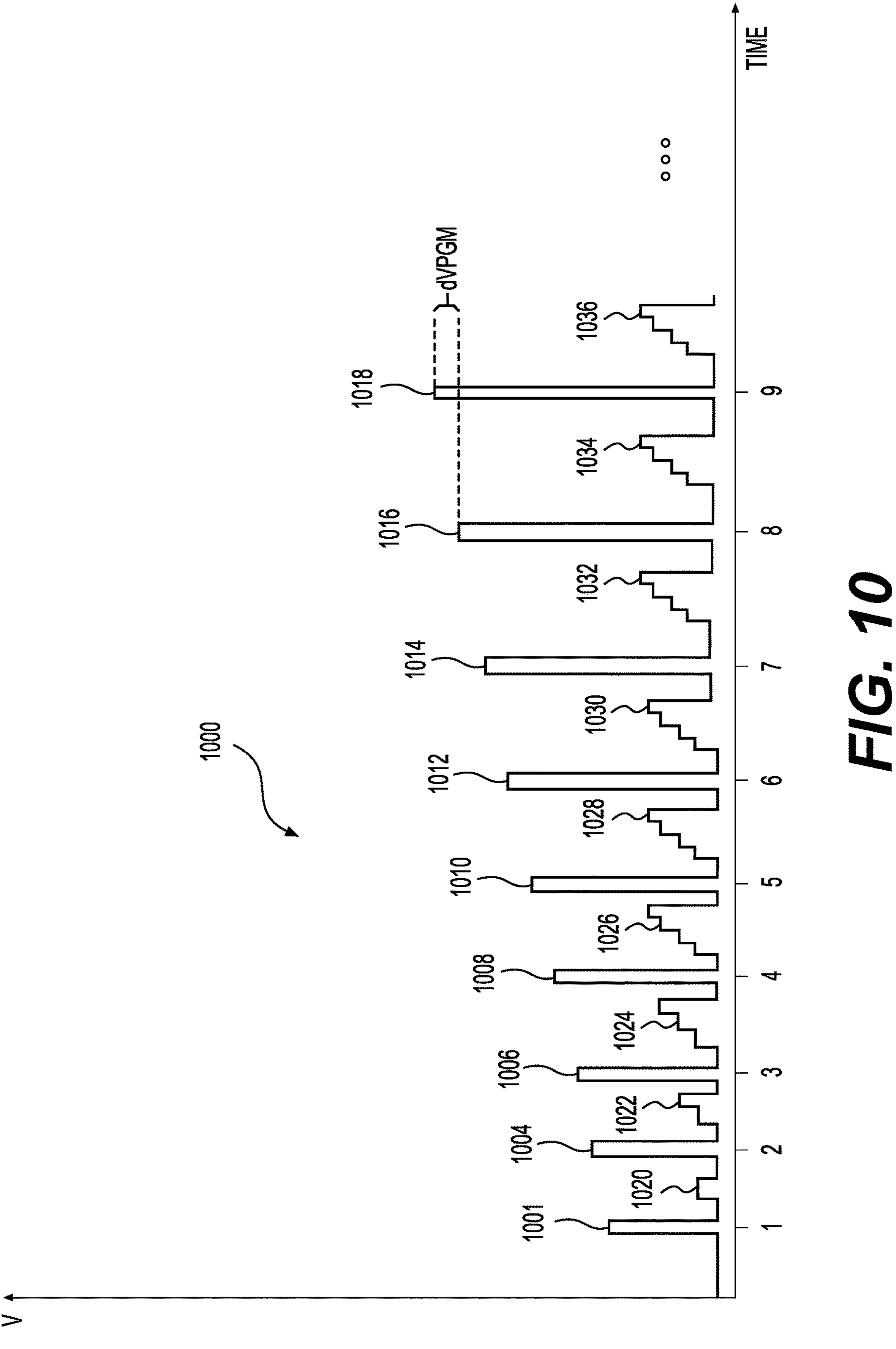
FIG. 10 is a waveform of the voltages applied to a selected word line during an example programming operation.

Programming the memory cells occurs on a word line-by-word line basis from one side of the memory block towards an opposite side of the memory block. In contrast, erase typically occurs on a block or sub-block basis. Typically, programming the memory cells of a selected word line to retain multiple bits per memory cell (for example, MLC, TLC, or QLC) starts with the memory cells being in the erased data state and includes a plurality of program loops. Each program loop includes both a programming pulse and a verify operation. FIG. 10 depicts a waveform 1000 of the voltages applied to a selected word line during an example programming operation for programming the memory cells of the selected word line to a greater number of bits per memory cell (e.g., TLC or QLC). As depicted, each program loop includes a programming pulse (hereinafter referred to a s a VPGM pulse) and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse voltage steps up, or increases, in each successive program loop. More specifically, the pulse train includes VPGM pulses that increase stepwise in amplitude with each successive program loop by a program voltage step size (dVPGM). As discussed in further detail below, following a suspension event, the magnitude of the voltage step size could vary from a baseline. A new pulse train starts with the VPGM pulse being at a starting voltage VPGMU and ends with it being at a final VPGM pulse, which does not exceed a maximum allowed voltage. The example pulse train 1000 includes a series of VPGM pulses 1001-1015 that are applied to a control gate of the selected word line to program the memory cells of that word line and that increase in amplitude by the program voltage step size dVPGM between pulses.

One or more verify pulses 1016-1029 are provided after each VPGM pulse, based on the target data states which are being verified in the respective program loops. The verify voltages may be the voltages Vv1-Vv7 shown in FIG. 9. Concurrent with the application of the verify voltages, a sensing operation can determine whether a particular memory cell in the selected word line has a threshold voltage Vt above the verify voltage Vv associated with its intended data state by sensing a current through a string that contains the memory cell. If the memory cell passes verify, programming of that memory cell is completed and further programming of that memory cell is inhibited (or locked out) for all remaining program loops by applying an inhibit voltage to a bit line coupled with the memory cell concurrent with the VPGM pulse and by skipping verify for those memory cells. Programming proceeds until all (or a sufficient number of) memory cells of the selected word line pass verify for their intended states, in which case, programming passes, or until a predetermined maximum number of program loops is exceeded, in which case, programming fails. In some embodiments, the memory cells of a word line can be divided into a series of string groups that can be programmed independently of one another and programming can commence from one string group to another string group across the selected word line before proceeding to the next sequential word line in the memory block.

Programming of a memory cell can be slowed when the memory cell has a threshold voltage Vt which is close to but below the threshold voltage Vt range of its intended data state. Specifically, in a Quick Pass Write (QPW) technique, each programmed data state includes two verify voltages, verify low VL and verify high VH. If a memory cell is detected to have a threshold voltage Vt between verify low VL and verify high VH, then in the following VPGM pulse, a QPW bias voltage is applied to the bit line coupled with that memory cell. The QPW bias voltage increase the voltage in the channel containing the memory cell for which slow programming is desired, thereby reducing the voltage difference between the VPGM voltage and the channel and slowing the flow of electrons into the charge trapping material of the memory cell being programmed. Any memory cell with a threshold voltage VT that passes the verify high VH voltage is still locked down or inhibited, for all remaining program loops by applying an inhibit voltage to the bit line coupled with the memory cell and by skipping verify for that memory cell.

Figures 11, 12:
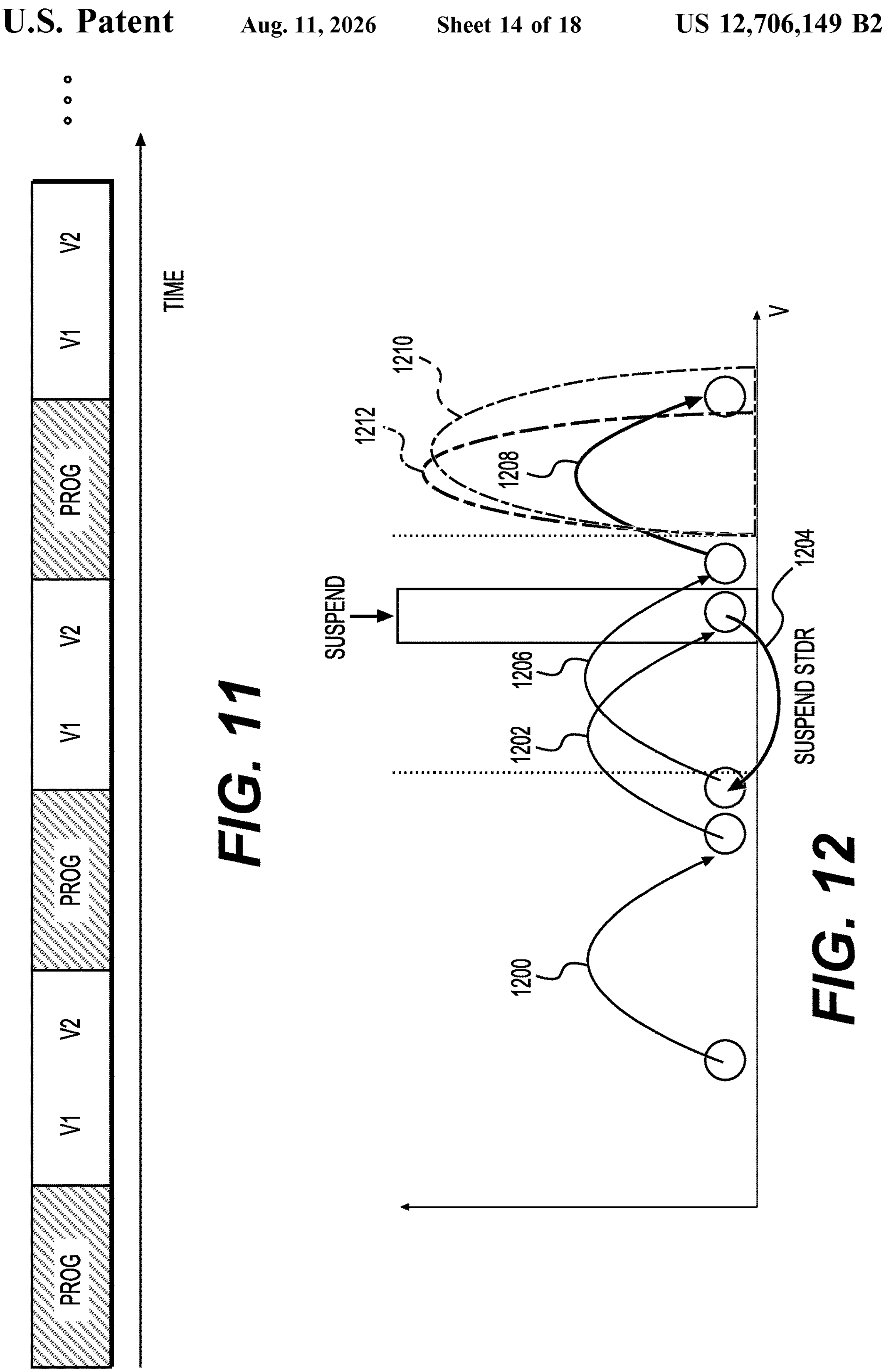
FIG. 11 is a time chart illustrating the steps performed during an example programming operation.
FIG. 12 is a plot depicting the threshold voltage of an example memory cell during a programming operation in which a suspension event occurs.

Typically, a programming operation continues uninterruptedly from beginning until end as illustrated in the example timeline depicted in FIG. 11 where "Prog" depicts a VPGM pulse and "V1" and "V2" depict verify pulses for any two data states and/or a verify low and a verify high for the same data state (additional verify pulses could also be conducted in each program loop). However, in some cases, a programming operation can be suspended so that the memory device can do another operation, e.g., read data in another memory block. The length of this "suspend time" (the time that the programming operation of the selected word line WLn is suspended) can vary depending on the other operation that is performed. In other words, in some cases, the suspend time can be very short (e.g., less than 1 ms), very long (e.g., more than 10 s), or anywhere in between. A suspend-resume-go (SRG) technique is a mode where the memory device pauses the programming operation for the suspend time and resumes the programming operation once the suspend time is completed.

In some cases, during the suspend time, the threshold voltages Vt of the memory cells in the selected word line can begin to drift, or fall, due to short term data retention (STDR) effects. Because of threshold voltage Vt drifting, once the programming operation resumes, if the programming voltage VPGM is increased by the default step size dVPGM in the following program loop, this could lead to over programming of some memory cells. For example, FIG. 12 illustrates the path the threshold voltage Vt of a single memory cell of a selected word line during such a programming operation that gets suspended. In this figure, line 1200 illustrates the increase in the threshold voltage Vt of an example memory cell during a first VPGM pulse, which may or may not be a first VPGM pulse of the programming operation. Following the first VPGM pulse, the threshold voltage Vt remains below the verify low VL voltage, and thus, in the second VPGM pulse, the memory cell receives another VPGM pulse without the QPW bias to slow programming. Line 1202 illustrates the increase in the threshold voltage Vt during the second VPGM pulse. At this point in time (after the second VPGM pulse and before the third VPGM pulse), the programming operation is suspended. Vt drift causes the threshold voltage Vt of the memory cell to fall from between the verify low VL voltage and the verify high VH voltage to back below the verify low VL voltage, as illustrated with line 1204. Programming then resumes when the suspension event is completed. As illustrated with line 1206, in the third VPGM pulse, the threshold voltage Vt of this memory cell is increased to nearly the verify high VH voltage. Finally, in the fourth VPGM pulse, the memory cell is programmed at a slower rate due to the application of a QPW bias voltage to the bit line coupled to the memory cell and the threshold voltage Vt is increased (line 1208) to its final threshold voltage Vt, which is higher than it would have been if not for the suspension of the programming operation. This may happen to other memory cells in the selected word line, and thus, the final threshold voltage distribution (line 1210) for the target data state is wider (less desirable) because of the suspension than it would have been if there was no suspension (line 1214). This results in a reduced Vt window and less data reliability.

Figure 14:
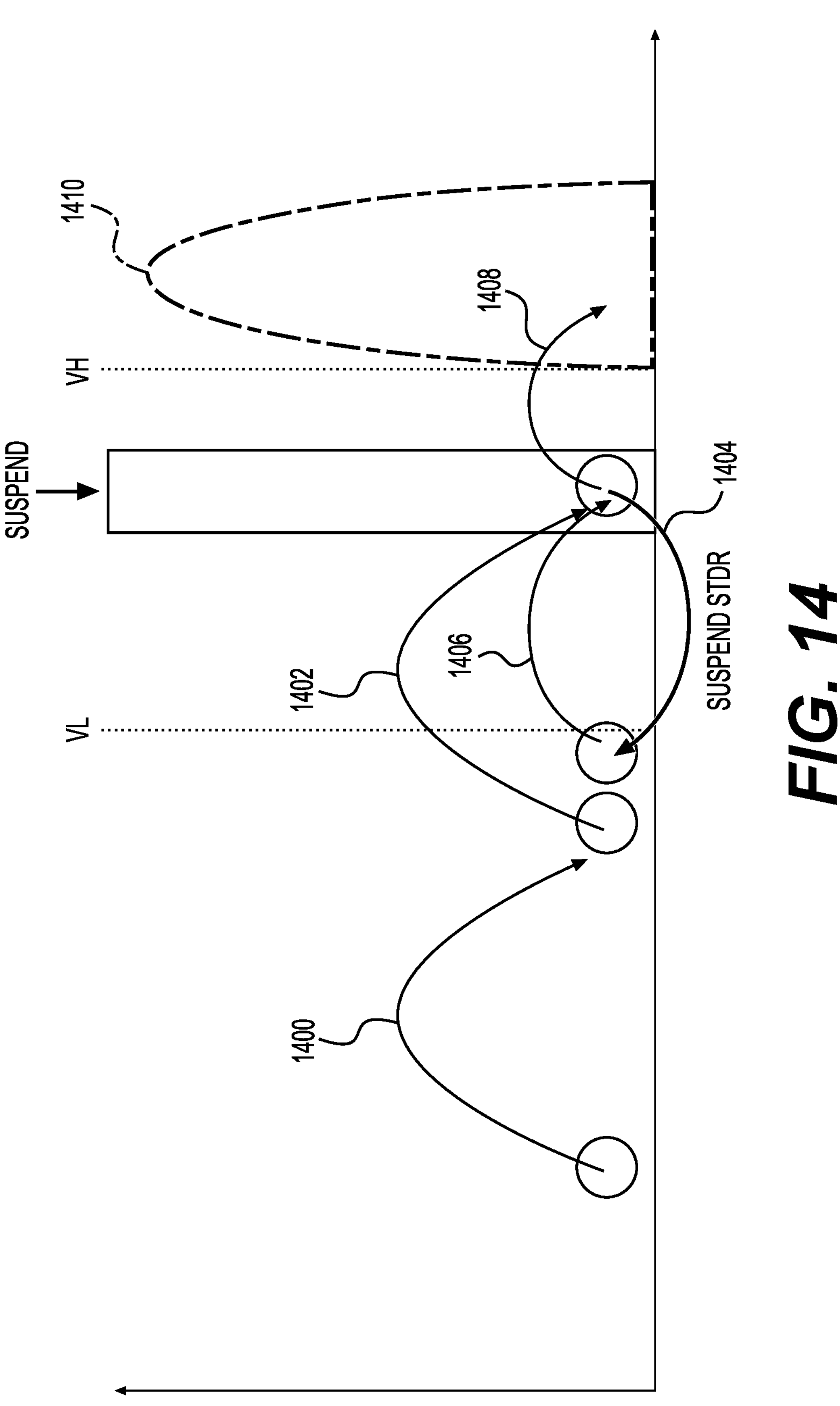
FIG. 14 is a plot depicting the threshold voltage of an example memory cell during a programming operation in which a suspension event occurs and wherein the programming techniques of the present disclosure are applied to prevent overprogramming.

To address this overprogramming problem, according to some techniques, in the following programming loop, rather than increasing the programming voltage VPGM by the default or baseline step size dVPGM, the programming voltage VPGM can instead be increased by a comparatively smaller step size dVPGM_SRG. FIG. 14 depicts a plot of the threshold voltage Vt of a memory cell being programmed to a given data state where the smaller step size dVPGM_SRG is employed following the suspension. in this figure, line 1400 illustrates the increase in the threshold voltage Vt of an example memory cell during a first VPGM pulse. Following the first VPGM pulse, the threshold voltage Vt remains below the verify low VL voltage, and thus, in the second VPGM pulse, the memory cell receives another VPGM pulse without the QPW bias to slow programming. Line 1402 illustrates the increase in the threshold voltage Vt during the second VPGM pulse. At this point in time (after the second VPGM pulse and before the third VPGM pulse), the programming operation is suspended. Vt drift causes the threshold voltage Vt of the memory cell to fall from between the verify low VL voltage and the verify high VH voltage to back below the verify low VL voltage, as illustrated with line 1404. So far, everything is the same as occurred in FIG. 12, but they diverge from here. Programming then resumes, and the programming voltage VPGM is increased by the smaller step size dVPGM_SRG. As a result of this, as illustrated with line 1406, in the third VPGM pulse, the threshold voltage Vt of this memory cell is increased to approximately the same level it was at before the suspension event. The threshold voltage Vt of the memory cell is now between the verify low VL and verify high VH voltages, and therefore, in the fourth VPGM pulse (line 1408), programming is slowed by QPW. The result is a tighter Vt distribution 1410 because the threshold voltage Vt exceeds the verify high VH voltage by a lesser degree and an improved final Vt distribution for the target data state as compared to the process of FIG. 12.

However, while the smaller step size dVPGM_SRG may at least partially correct Vt drift, in some cases, the memory cells do not experience much Vt drift. In these circumstances, the smaller step size dVPGM_SRG may result in unnecessary program loops to complete programming, which will induce a performance penalty. In other words, the use of the smaller step size dVPGM_SRG in a SRG operation may increase programming time in some cases.

Accordingly, the use of the smaller step size dVPGM_SRG is advantageous in terms of programming reliability if the memory cell being programmed did experience Vt drift but is disadvantageous in terms of performance with little or no gain in reliability if the memory cell being programmed did not experience Vt drift.

Figures 13A, 13B:
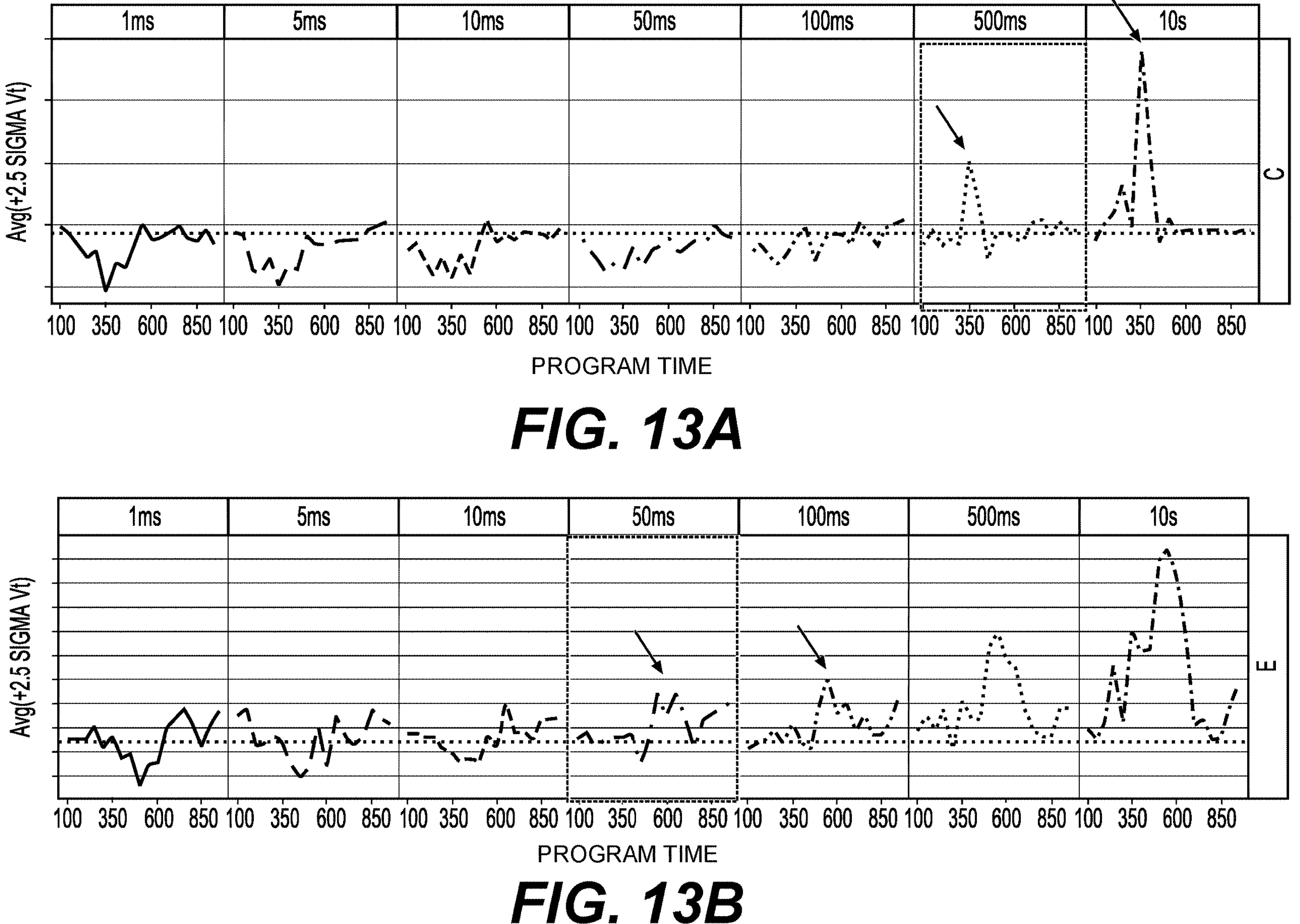
FIG. 13A is a plot illustrating the difference from the average voltage versus voltage for a plurality of memory cells programmed to an S3 data state following different suspension durations.
FIG. 13B is a plot illustrating the difference from the average voltage versus voltage for a plurality of memory cells programmed to an S6 data state following different suspension durations.

It has been found that the amount of Vt drift a memory cells experiences depends largely on two factors: which data state is the target data state at the time of the suspension event and the how long the suspension duration was. For example, FIG. 13A illustrates a plurality of plots that illustrate the differences between the threshold voltages Vt of a plurality of plurality of memory cells programmed to a the S3 data state and the intended threshold voltages Vt for the S3 data state versus voltage for a range of different suspend times (1 ms, 5 ms, 10 ms, 50 ms, 100 ms, 500 ms, and 10 s). In each of these plots, a spike at a particular voltage indicates overprogramming has occurred at that voltage. In this case, no overprogramming at the S3 data state occurred for any of the suspend times up to 100 ms. However, when the suspend time was 500 ms or 10 s, over programming did occur in the memory cells that were programmed to the S3 data state. Turning now to FIG. 13B, this figure illustrates a plurality of similar plots but for the memory cells that are programmed to the S5 data state. In this case, no overprogramming occurred for the suspend times up to 10 ms. However, overprogramming occurred for all of the suspend times 50 ms and above. Therefore, the memory cells are more susceptible to Vt drift and over programming at higher target data states than at lower data states. Likewise, the memory cells are more resistant to Vt drift and over programming at lower target data states than at higher data states. These trends continue across all of the programmed data states of TLC or QLC.

The memory cells at the higher data states are more vulnerable to suspend because, due to the comparatively larger numbers of electrons in their charge storing materials, they have a stronger built in electric field, which can cause electrons to be detrapped from the charge storing materials more easily.

Turning now to the table presented in FIG. 15, according to the exemplary embodiment, a look-up table is provided with the programmed data states of TLC (except S7 as discussed below) along with predetermined threshold suspend times for those programmed data states and whether to employ the lower step size voltage dVPGM_SRG if the suspend time exceeds the predetermined threshold time. In other words, each of these programmed data states is associated with a unique predetermined threshold suspend time. For example, the predetermined threshold suspend time for the S2 data state is 500 ms; the predetermined threshold suspend time for the S3 data state is 100 ms; the predetermined threshold suspend time for the S4 data state is 50 ms; the predetermined threshold suspend time for all of the S5 and S6 data states is 10 ms. There is no predetermined threshold suspend time for the last data state (S7) because over programming of the S7 data state does not compromise the Vt window or data reliability. A similar look-up table can be generated for QLC programming.

During programming, when a suspension event is detected, the suspend time is monitored and a suspension duration is determined. At this time, a target data state is also determined. Then, through the look-up table, it is determined whether the reduced step size dVPGM_SRG should be employed or not based on the target data state and the suspension duration. In other words, if the suspend time was greater than the predetermined threshold suspend time associated with the target data state, then the programming voltage VPGM will be increased by the reduced step size dVPGM_SRG before the following VPGM pulse of the next program loop. For example, if the target data state is the S1 data state when a suspension event occurs, then regardless of the suspension duration, the programing voltage VPGM will be increased by the baseline step size dVPGM because the S1 data state is not as susceptible to Vt drift as the higher data states. If the target data state is the S2 data state when a suspension event occurs, then if the suspension duration is greater than 500 ms, before the next VPGM pulse, the programming voltage VPGM is increased by the smaller step size dVPGM_SRG. If the target data state is the S3 data state when the suspension event occurs, then if the suspension duration is greater than 100 ms, before the next VPGM pulse, the programming voltage VPGM is increased by the smaller step size dVPGM_SRG. If the target data state is the S4 data state when the suspension event occurs, then if the suspension duration is greater than 50 ms, before the next VPGM pulse, the programming voltage VPGM is increased by the smaller step size dVPGM_SRG. If the target data state is the S5 or S6 data state when the suspension event occurs, then if the suspension duration is greater than 10 ms, before the next VPGM pulse, the programming voltage VPGM is increased by the smaller step size dVPGM_SRG. If the target data state is the S7 data state when the suspension event occurs, then regardless of the suspension duration, before the next VPGM pulse, the programming voltage VPGM is increased by the baseline step size dVPGM because over programming is less concerning at the highest data state. The specific threshold times on the table can vary from those of the exemplary embodiment set forth in the table of FIG. 15.

Figure 16:
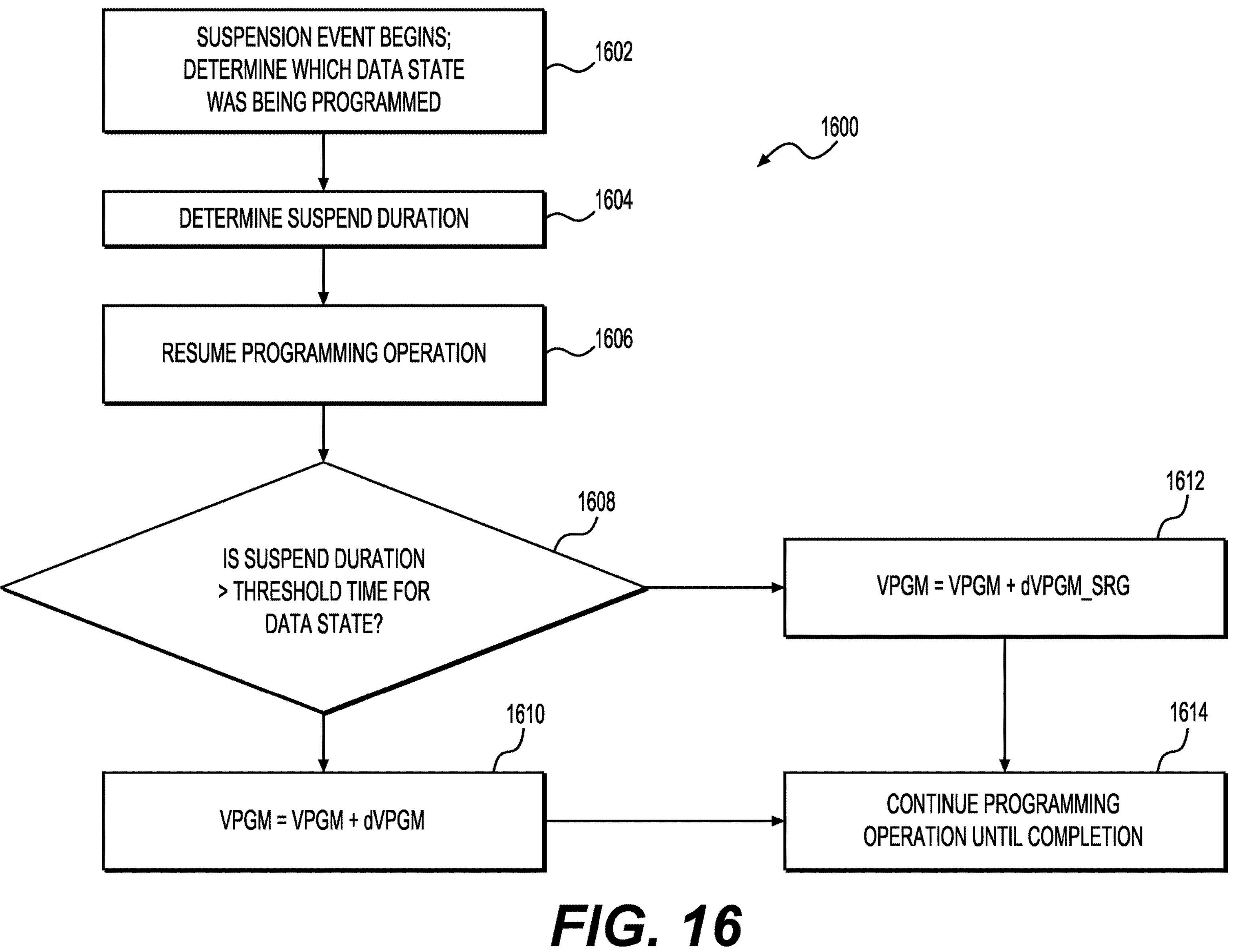
FIG. 16 is a flow chart depicting the steps of programming the memory cells of a selected word line according to an example embodiment of the present disclosure.

FIG. 16 includes a flow chart 1600 that depicts the steps of programming the memory cells of a selected word line according to one embodiment of the present disclosure. These steps could be performed by the controller; a processor or processing device or any other circuitry, executing instructions stored in memory; and/or other circuitry described herein that is specifically configured/programmed to execute the following steps.

The process set forth in the flow chart 1600 of FIG. 16 begins during a programming operation in a selected word line WLn. At step 1602, a suspension event begins, and it is determined which data state was being programmed (hereinafter referred to as a "target data state") at the time of the suspension event. If multiple data states were being verified during the program loop. For example, if a suspension event occurs during a program loop that includes verify pulses for data states S3, S4, and S5, then the target data state is the S3 data state. As illustrated in FIG. 15, in some embodiments, the determination of which data state is the target data state can be based on the time during the programming operation in which the suspension event started. For example, if the suspension event starts before 200 s, then the S1 data state is the target data state. If the suspension event starts between 200 and 300 s into the programming operation, then the S3 data state is the target data state. The suspension event could be, for example, a read operation in another memory block.

Turning back to FIG. 16, at step 1604, the suspension event is monitored and a suspension duration is determined.

At step 1606, the programming operation of the selected word line WLn resumes. At decision step 1608, it is determined if the suspension duration is greater than the threshold time associated with the target data state.

If the answer at decision step 1608 is "no," then before the next VPGM pulse, at step 1610, the programming voltage VPGM is incrementally increased by the baseline step size dVPGM, i.e., VPGM=VPGM+dVPGM. If the answer at decision step 1608 is "yes," then before the next VPGM pulse, at step 1612, the programming voltage VPGM is incrementally increased by the smaller step size dVPGM_SRG, i.e., VPGM=VPGM+dVPGM_SRG.

Following either step 1610 or 1612, at step 1614, the programming operation resumes with one or more program loops until programming is completed.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. By way of example, "a processor" programmed to perform various functions refers to one processor programmed to perform each and every function or more than one processor collectively programmed to perform each of the various functions. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of performing a programming operation in a memory device, comprising steps of:

preparing a memory block that includes an array of memory cells that are arranged in a plurality of word lines;

in a program loop, applying a programming pulse at a programming voltage VPGM to a selected word line of the plurality of word lines to program a plurality of the memory cells of the selected word line to a target data state of a plurality of data states and wherein each data state of the plurality of data states is associated with a unique threshold;

suspending the programming operation for a suspension duration and then resuming the programming operation;

before a next program loop, comparing the suspend duration to the threshold that is unique to the target data state;

in response to the suspension duration being less than or equal to the threshold that is unique to the target data state, incrementally increasing the programming voltage VPGM by a baseline step size dVPGM; and in response to the suspension duration being greater than the threshold that is unique to the target data state, incrementally increasing the programming voltage VPGM by a reduced step size dVPGM_SRG that is less than the baseline step size dVPGM.

2. The method as set forth in claim 1, wherein the threshold duration of at least one of the plurality of data states, which is at a higher voltage range, is less than the threshold duration of at least one of the plurality of data states, is at a lower voltage range.

3. The method as set forth in claim 1, further including a step of determining a delay time that is from a start of the programming operation to a beginning of the step of suspending the programming operation, and wherein the target data state is determined based on the delay time.

4. The method as set forth in claim 1, wherein in response to the target data state being a first programmed data states of the plurality of data states, then the step size is a baseline step size dVPGM.

5. The method as set forth in claim 1, wherein in response to the target data state being a last programmed data state of the plurality of data states, then the step size is a baseline step size dVPGM.

6. The method as set forth in claim 1, wherein the program loop further includes a verify operation that includes at least a first verify pulse at a verify low voltage and a second verify pulse at a verify high voltage, and further including the step of:

applying a quick pass write (QPW) biasing voltage to a bit line coupled to a selected memory cell of the selected word line in response to the selected memory cells being detected in the verify operation as having a threshold voltage that is between the verify low voltage and the verify high voltage.

7. A memory device, comprising:

a memory block that includes an array of memory cells that are arranged in a plurality of word lines;

circuitry that is configured to program the memory cells of a selected word line of the plurality of word lines, during programming, the circuitry being configured to;

in a program loop, apply a programming pulse at a programming voltage VPGM to a selected word line of the plurality of word lines to program a plurality of the memory cells of the selected word line to a target data state of a plurality of data states, each data state of the plurality of data states being associated with a unique threshold;

suspend the programming operation for a suspension duration and then resume the programming operation;

before a next program loop, compare the suspend duration to the threshold that is unique to the target data state;

in response to the suspension duration being less than or equal to the threshold that is unique to the target data state, incrementally increase the programming voltage VPGM by a baseline step size dVPGM; and in response to the suspension duration being greater than the threshold that is unique to the target data state, incrementally increase the programming voltage VMPGM by a reduced step size dVPGM_SRG that is less than the baseline step size dVPGM.

8. The memory device as set forth in claim 7, wherein the threshold duration of at least one of the plurality of data states, which is at a higher voltage range, is less than the threshold duration of at least one of the plurality of data states, is at a lower voltage range.

9. The memory device as set forth in claim 7, wherein the circuitry is further configured to determine a delay time that is from a start of the programming operation to a beginning of the step of suspending the programming operation and to determine the target data state based on the delay time.

10. The memory device as set forth in claim 7, wherein in response to the target data state being a first programmed data states of the plurality of data states, then the step size is a baseline step size dVPGM.

11. The memory device as set forth in claim 7, wherein in response to the target data state being a last programmed data state of the plurality of data states, then the step size is a baseline step size dVPGM.

12. The memory device as set forth in claim 7, wherein the program loop further includes the circuitry performing a verify operation that includes at least a first verify pulse at a verify low voltage and a second verify pulse at a verify high voltage, and the circuitry is further configured to:

apply a quick pass write (QPW) biasing voltage to a bit line coupled to a selected memory cell of the selected word line in response to the selected memory cells being detected in the verify operation as having a threshold voltage that is between the verify low voltage and the verify high voltage.

13. An apparatus, comprising:

a memory block that includes an array of memory cells that are arranged in a plurality of word lines;

a programming means for programming the memory cells of a selected word line of the plurality of word lines, during programming, the programming means being configured to;

in a program loop, apply a programming pulse at a programming voltage VPGM to a selected word line of the plurality of word lines to program a plurality of the memory cells of the selected word line to a target data state of a plurality of data states, wherein each data state of the plurality of data states is associated with a unique threshold;

suspend the programming operation for a suspension duration and then resuming the programming operation;

before a next program loop, compare the suspend duration to the threshold that is unique to the target data state, in response to the suspension duration being less than or equal to the threshold that is unique to the target data state, incrementally increase the programming voltage VPGM by a baseline step size dVPGM; and in response to the suspension duration being greater than the threshold that is unique to the target data state, incrementally increase the programming voltage VMPGM by a reduced step size dVPGM_SRG that is less than the baseline step size dVPGM.

14. The apparatus as set forth in claim 13, wherein the threshold duration of at least one of the plurality of data states, which is at a higher voltage range, is less than the threshold duration of at least one of the plurality of data states, is at a lower voltage range.

* * * * *